(12) United States Patent
Korden et al.

(10) Patent No.: US 6,847,271 B2
(45) Date of Patent: Jan. 25, 2005

(54) COMPONENT HAVING AN ACOUSTICALLY ACTIVE MATERIAL FOR TUNING DURING OPERATION

(75) Inventors: Christian Korden, Munich (DE); Thomas Ostertag, Geretsried (DE); Werner Ruile, Munich (DE)

(73) Assignee: Siemens Aktiengesellschaft, Munich (DE)

(*) Notice: Subject to any disclaimer, the term of this patent is extended or adjusted under 35 U.S.C. 154(b) by 42 days.

(21) Appl. No.: 10/381,364

(22) PCT Filed: Sep. 20, 2001

(86) PCT No.: PCT/DE01/03648

§ 371 (c)(1),
(2), (4) Date: Mar. 25, 2003

(87) PCT Pub. No.: WO02/25811

PCT Pub. Date: Mar. 28, 2002

(65) Prior Publication Data

US 2004/0104789 A1 Jun. 3, 2004

(30) Foreign Application Priority Data

Sep. 25, 2000 (DE) .......................... 100 47 379

(51) Int. Cl.⁷ .............................. H03H 9/54; H03H 9/64
(52) U.S. Cl. ....................... 333/188; 333/189; 333/193; 310/311; 310/315; 310/313 A; 310/346; 310/313 R
(58) Field of Search ................................ 333/188–196; 310/311, 315, 313 R, 313 A–313 D, 322, 346

(56) References Cited

U.S. PATENT DOCUMENTS

| | | | |
|---|---|---|---|
| 3,840,826 A | 10/1974 | Toda et al. .................. 333/144 |
| 4,464,639 A | 8/1984 | Staples ........................ 333/154 |
| 5,351,219 A | * 9/1994 | Adachi et al. ............... 367/140 |
| 5,446,306 A | * 8/1995 | Stokes et al. ................ 257/416 |
| 5,691,698 A | 11/1997 | Scholl et al. ............. 340/572.5 |
| 5,714,917 A | * 2/1998 | Ella ............................ 332/144 |
| 5,841,214 A | 11/1998 | Schmidt et al. .......... 310/313 D |
| 5,910,779 A | 6/1999 | Bulst et al. ................. 340/10.2 |
| 5,966,008 A | 10/1999 | Maier et al. ................... 324/96 |
| 5,992,215 A | 11/1999 | Caron et al. ................ 73/24.01 |
| 6,029,324 A | 2/2000 | Wixforth ..................... 257/416 |
| 6,045,977 A | 4/2000 | Chandross et al. .......... 430/311 |
| 6,084,503 A | 7/2000 | Ruile et al. ................. 340/10.1 |
| 6,583,688 B2 | * 6/2003 | Klee et al. ................... 333/188 |
| 6,724,280 B2 | * 4/2004 | Shamsaifar et al. ......... 333/209 |
| 6,747,529 B2 | * 6/2004 | Abe et al. .................... 333/188 |

FOREIGN PATENT DOCUMENTS

| | | |
|---|---|---|
| DE | 198 60 058 | 3/2000 |
| EP | 0 619 906 | 10/1994 |
| EP | 0 651 344 | 3/1995 |
| EP | 0 655 701 | 5/1995 |
| EP | 0 746 775 | 12/1996 |
| EP | 0 834 989 | 4/1998 |
| WO | WO 96/08047 | 3/1996 |
| WO | WO 97/18944 | 5/1997 |

OTHER PUBLICATIONS

Kobel et al., "Generation of Micropatterns in Poly(3–Methyl–Thiophene) Films Using Microlithography: A First Step in the Design of an All–Organic Thin–Film Transistor", Synthetic Metals, 22 (1988) pp. 265–271.

(List continued on next page.)

*Primary Examiner*—Barbara Summons
(74) *Attorney, Agent, or Firm*—Young & Thompson

(57) ABSTRACT

A component having an acoustically active material, whose acoustic constants can be at least partially altered. The acoustically active material is located at least partially at a phase transition point and/or in the vicinity of a phase transition point.

17 Claims, 1 Drawing Sheet

OTHER PUBLICATIONS

Makela et al., "Lithographic patterning of conductive polyanlline", Synthetic Metals, 101 (1999) pp. 705–706.

Drury et al., "Low–cost all–polymer integrated circuits", Appl. Phys. Lett., vol. 73, No. 1, 1998, pp. 108–110.

Dai et al., "Photochemical Generation of Conducting Patterns in Polybutadiene Films", Macromolecules, 1996, Bd. 29, Nr. 1, pp. 282–287.

Re Newman et al., "Smart Systems: Microphones, Fish Farming, and Beyond", Chemtech, online!, vol. 29, No. 12, Dec. 1, 1999 (Dec. 1, 1999), pp. 38–46, XP002187889, Retrieved from the Internet::,<URL:http://pubs.acs.org/hotartcl/chemtech/99/dec/newn.html>'retriev d on Jan. 21, 2002l, p. 1–6, p. 9.

Fousek J:, "Domain investigations: a select review", Applications of Ferroelectrics, 1992. ISAF'92., Proceedings of the Eighth IEEE International Symposium on Greenville, SC, USA Aug. 30 –Sep.2, 1992, New York, NY, USA IEEE, US, pp. 171–178, XP010102771, ISBN: 0–7803–0465–9, p. 173, left–hand column, line 18–page 174, left–hand column, line 4.

Krupanidhi S B et al:., "Studies on Structural and electrical properties of barium strontium titanate thin films developed by metallo–organic decomposition", Thin Solid Films, Elsevier–Sequoia S.A. Lausanne, CH, vol. 305, no. 1–2, Aug 1, 1997 (Aug. 1, 1997), pp. 144–156, XP004088975, ISSN: 0040–6090, p. 153, left–hand column, line 22–p. 155, left–hand column, line 20.

Clark T.C. Nguyen., "Micromachining Technologies for Miniaturized Communication Devices", Proceeding of Spie: Micromachining and Microfabrication, Santa Clara CA, Sep. 20–22, 1998, pp., 24–38.

* cited by examiner

COMPONENT HAVING AN ACOUSTICALLY ACTIVE MATERIAL FOR TUNING DURING OPERATION

CROSS REFERENCE TO RELATED APPLICATIONS

This is the 35 USC 371 National Stage of International Application PCT/DE01/03648 filed on Sep. 20, 2001, which designated the United States of America.

FIELD OF THE INVENTION

The invention relates to a component in the form of a filter having an acoustically active material and also a method for the operation of such a component.

BACKGROUND OF THE INVENTION

Since the standards relating to mobile telecommunications systems are different throughout the world, but also because an ever increasing number of different standards is being offered within a transmission area depending on the required bandwidth, it would be desirable to have a mobile telecommunications device capable of covering all these standards or at least some of them. In this situation, the problem consists in the fact that the send and receive bands lie in different frequencies and moreover have different bandwidths. An electronically tunable filter for telecommunications devices is therefore desirable which enables the telephone to be set to the desired standard by means of software.

Up to now there have been no tunable filters which solve the above problem. A workaround for this is offered by using the surface acoustic wave filters (SAW filters) which are proven in telecommunications technology and switching back and forth between these filters as required. Surface acoustic wave components are used in many variations as wirelessly interrogable or self-sending sensors, identification markers or filters. Embodiments according to the prior art are published for example in DE 198 60 058 C1, EP 0 746 775 B1, EP 0 655 701 B1, EP 0 651 344 B1, EP 0 619 906 B1, U.S. Pat. No. 5,691,698, U.S. Pat. No. 5,841,214, U.S. Pat. No. 5,966,008,U.S. Pat. No. 5,910,779, U.S. Pat. No. 6,029,234, U.S. Pat. No. 6,084,503.

SAW filters themselves are known for their stability and can therefore unfortunately not be tuned or can only be tuned within very tight limits. The use of a plurality of filters in one device naturally results in a greater space requirement and increased costs since a separate filter is required for each standard. Since, in addition, these SAW filters are not capable of being integrated into semiconductor technology, hybrid solutions must be sought.

In order to at least get away from these hybrid solutions, FBARs (film bulk acoustic resonators), which operate using bulk acoustic waves are frequently proposed as they can, at least in part, be manufactured to be CMOS compatible. However, a separate filter or even a plurality of filters is also required in this situation for each standard. The main problem with this solution, however, consists in the fact that the required frequency precision cannot be achieved on account of technical manufacturing considerations, with the result that mass production and accompanying low prices are not available.

An FBAR is known from EP 0 834 989 A2 whose elastic constants are modifiable at least in part. However, these changes are so small that they do not allow variations in production to be brought under control, let alone allow a tunable filter to be implemented.

R. E. Newnham, A. Amin: "Smart Systems: Microphones, fish Farming, and beyond" CHEMTECH, [Online] Vol. 29, No. 12, 1 Dec. 1999, pp. 38 to 46, American Chemical Society, discloses piezoelectric ceramics having compounds close to the second phase transition. This means that load is measured in sensors and load is generated in actuators.

U.S. Pat. No. 4,464,639 describes the properties of ferroelectric crystals, in particular the relationship between ferroelectric state and piezoelectric state in such crystals and the ability to modify pressure and load by means of electric fields. Furthermore, the phase transition from the ferroelectric phase to the paraelectric phase at the Curie point is described. A method is described for setting the frequency properties of a crystal by means of polarization above the transition temperature and operation beneath the transition temperature, whereby twice the frequency of the interdigital converter can be attained. Finally, an application is illustrated for a filter which is tuned above the transition temperature and operated beneath the transition temperature.

SUMMARY OF THE INVENTION

On the basis of the aforementioned, the object of the invention is to propose a filter whose acoustic constants are capable of being modified to such an extent during operation that it can be set with the aid of a control facility to the frequency range of the desired telecommunications standard in each case. In this situation, acoustic constants are understood in particular to be the elastic constants such as the rigidity and the density. These material constants determine the speed of sound and thus the frequency of an acoustic oscillation in the acoustically active material.

This object is achieved by a filter as disclosed below.

The invention is based on the knowledge that a major change in the acoustic constants can be achieved at a phase transition point and/or in the vicinity of such a point of the material. By changing the acoustic constants of the acoustically active material, the frequency of the acoustic waves running therein can be set in the desired manner. This applies both to surface waves and also to bulk acoustic waves, with the result that the filter can be optionally designed to work with surface acoustic waves and/or bulk acoustic waves. If the acoustically active material in the filter is at least in part a piezoelectric material, then it is possible to resort to the known techniques for the conversion of electromagnetic waves into acoustic waves. In particular, the use of interdigital converters for surface wave components or the application of electrodes on two opposite sides of the acoustically active material in the case of bulk acoustic wave components are conceivable for this purpose.

The proximity to the phase transition point is given when the acoustic constants of the acoustically active material can be influenced such that the result is a change in speed of approximately at least 0.5%. This is sufficient in order to compensate for production variations with regard to the resonator. For further applications, however, a minimum change in speed of 1%, 5% and in particular 10% is preferable.

When a piezoelectric material is used as the acoustically active material, the phase transition point between the ferroelectric phase and the paraelectric phase is preferably chosen as the phase transition point. In this case, the acoustic constants of the acoustically active material are capable of modification on a further scale, in particular through changing the piezoelectric coupling. Furthermore, in order to be able to utilize the piezoelectric effect for coupling electromagnetic waves to the acoustic waves in the acoustically active material, operation should preferably take place in this situation on the side of the ferroelectric phase of the phase transition point.

If a spatially defined part of the acoustically active material is situated in the first phase while another spatially defined part is situated in the second phase, then in accordance with the Kramers Kronig relation the attenuation occurring can be avoided directly at the phase transition point.

By preference, the filter contains means for modifying the acoustic constants of the acoustically active material and/or connections for such means. These means can, for example, have elements for the application of an electrical voltage, in particular to the acoustically active material, by means of which the acoustic constants of the material can be modified. These elements for applying an electrical voltage can be designed, for example, in the form of electrodes which are located on the filter and in particular on the acoustically active material. For AC voltages, however, elements which operate inductively are also conceivable.

The means for modifying the acoustic constants can also have elements for setting the temperature, in particular in the acoustically active material, by means of which the acoustic constants of the acoustically active material can be modified. Such elements can be designed in any form of heating and/or cooling devices. In particular, a design using Peltier elements is conceivable.

In addition, the means for modifying the acoustic constants can also have elements for setting further thermodynamic variables, such as pressure for example, in particular in the acoustically active material, by means of which the acoustic constants of the acoustically active material can be modified.

The filter is preferably designed as a surface acoustic wave component, bulk acoustic wave component and/or electrostatically coupled diaphragm resonator and, in particular in respect of its acoustically active material, is dimensioned such that it can be used as a filter in the desired frequency ranges.

In a method according to the invention for the operation of a component having an acoustically active material, the acoustic constants of the acoustically active material are modified, whereby the acoustically active material is located at least in part at a phase transition point and/or in the vicinity of a phase transition point.

A filter of the type described above is advantageously used in this method.

BRIEF DESCRIPTION OF THE DRAWINGS

Further important features and advantages of the invention will emerge from the description of an embodiment with reference to the drawings. In the drawings.

DETAILED DESCRIPTION OF THE INVENTION

Figure 1:
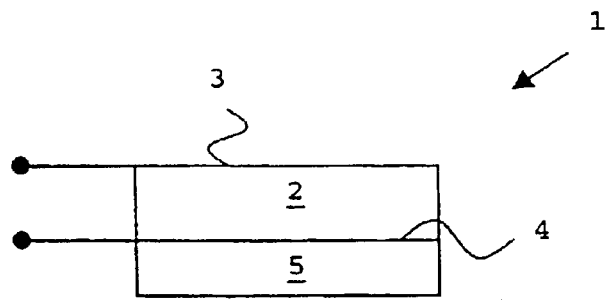
FIG. 1 shows a filter having an acoustically active material.

FIG. 1 shows a filter in the form of a component 1 having an acoustically active material 2. The acoustically active material 2 consists of a piezoelectric substance such as $LiNbO_3$, $LiTaO_3$, $Bi_{12}GeO_{20}$, $Li_2B_4O_7$, $AlPO_4$, GaAs, ZnO and/or quartz, for example.

The acoustically active material is located at least in part at a phase transition point and/or in the vicinity of a phase transition point. This phase transition point is in particular the Curie point in the case of ferroelectric materials. It is known that the dielectric constants $\epsilon$ in the vicinity of the Curie point change very significantly with the temperature, but also with the applied electric field. This change alters the rigidity c of the material by means of the piezoelectric coupling.

$$c = c_0 + \frac{d^2}{\epsilon},$$

where c represents the rigidity of the acoustic material with a piezoelectric effect and d represents the piezoelectric constants of the acoustically active material.

The dielectric constants $\epsilon$, the rigidities c, $c_0$ and the piezoelectric constants d are as a rule tensors.

If therefore the value for $\epsilon$ is extremely large, as is the case in the vicinity of the Curie point, then the piezoelectric stiffening $$\frac{d^2}{\epsilon},$$

which the acoustic material experiences as a result of the piezoelectric effect ceases and the rigidities are obtained as if no piezoeffect were present. If on the other hand the value of $\epsilon$ falls, then an increased rigidity occurs. In this case, the acoustically active material is modified in its entire affected volume.

A high level of instability is associated with this modifiability of the acoustic constants, particularly as far as the temperature is concerned. Further instability results from the production process, and also from a possible ageing effect. In order to maintain control over all these sources of instability a fixed reference is required to which one can relate in a control system. In this situation, the time constants for the instabilities are very variable. The production-dependent instability is not dependent on time and can therefore be compensated for by means of correction values $U_{production}$ for the voltage U which is to be applied. The correction values for compensating for the ageing stability $U_{ageing}$ simply need updating from time to time. These ageing effects then naturally also include all the effects which originate from the actual electronics. The correction values for compensating for the temperature $U_{temperature}$ must, on the other hand, be continuously refreshed since it is not only the ambient temperature which is capable of being slowly modified that plays a role but the temperature can itself also change during operation (self-heating).

In addition to these correction voltages, in the case of a tunable filter, the frequency itself must ultimately also be capable of being tuned in order to allow the corresponding frequency band or the required frequency $f_{required}$ to be set.

For this purpose, a voltage $U_{frequired}$ is applied.

In total, the superimposed value of all the voltages listed above is applied to the two electrodes 3, 4 located on the surface of the acoustically active material 2:

$$U_{FBAR} = U_{frequired} + U_{ageing} + U_{production} + U_{temperature} + U_{remainder}$$

The frequency $f_{actual}$ generated by the component 1 implemented as FBAR is related to a fixed reference frequency $f_{reference}$. The voltage $U_{FBAR}$ continues to be adjusted during this process until such time as $f_{actual} - f_{reference}$ assumes the desired value $f_{required} - f_{reference}$. In this situation, all other effects which may possibly still be remaining and have not been specifically listed above are also compensated for.

In addition, a Peltier element 5 is located on the acoustically active material 2, which is used to carry out a temperature compensation for the acoustically active material by means of heating or cooling. Given good thermal insulation and a low thermal capacity (diaphragm), the time constant in this case for the heating or cooling of the acoustically active material is small.

In addition to the use of FBARs as bulk thickness resonators, a development of the invention consists in using the acoustically modifiable layer in electrostatically coupled diaphragm resonators, such as are known from Clark T.-C. Nguyen: "Micromachining Technologies for Miniaturized Communication Devices", Proceedings of SPIE, Santa Clara, Calif., 1998, pp. 24–38. In this situation, the rigidity in the oscillating diaphragm is changed and thus a frequency detuning likewise results. The use of these resonators will preferably lie in the intermediate frequency range, in contrast to thickness resonators which are used in the front-end range. This development offers the possibility of integrating not only front-end filters but also intermediate frequency filters into semiconductor technology, with all the associated advantages. Front-end and intermediate frequency filters can even be manufactured on a chip with a control and regulation facility which, in part, enjoys shared usage.

Figure 2:
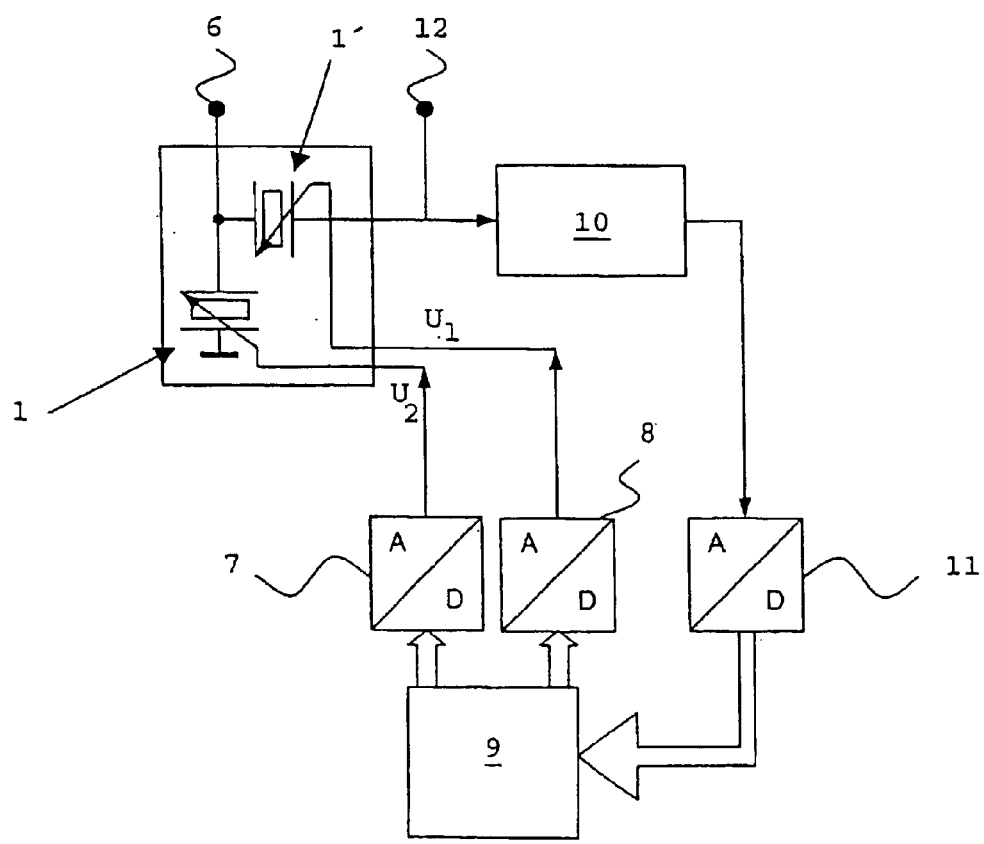
FIG. 2 shows a circuit for controlling this filter.

An example of a regulation facility is shown in FIG. 2. In this situation, two components 1, 1' according to the invention are designed as one-port resonators and arranged to form a tunable ladder type filter. An input signal is introduced by way of an input 6 into the tunable ladder type filter, in which a component 1' is connected in series in the signal path, while the other component 1 is connected in parallel with ground. The acoustic constants of both components and thus of their frequencies are regulated in the manner described above by way of control voltages $U_1$, $U_2$. The control voltages $U_1$, $U_2$ are regulated by way of D/A converters 7, 8 by a microcontroller 9. A useful signal filtered in the desired manner can be picked off at an output 12 of the tunable ladder type filter.

At the output of the component 1' which is connected in series with the signal path is situated a device 10 for measuring the strength of the receive field. The receive field strength measured by the device 10 for measuring the receive field strength is fed by way of an A/D converter 11 to the microcontroller 9.

The ladder type filter constructed from the components 1, 1' and connected upstream of the receiving channel is detuned by the microcontroller 9 in its mid-frequency range until a maximum is reached for the receive field strength at the output of the device 10 for measuring the receive field strength.

Moreover, it is not absolutely necessary to provide uninterrupted cover for the entire frequency band extending from 800 MHz to 2.5 GHz for current mobile telecommunications. It is sufficient to cover the ranges around 900 MHz and 2 GHz. The thing to do in the case of the FBARs would be to use harmonics. The lower frequency range is covered by the fundamental wave, while the first harmonic component is used for the upper range. It is possible to effect a mode selection by means of a suitable electrode configuration in the diaphragm structure of an FBAR and a corresponding control action, in other words to preferentially operate the filter either on the fundamental wave or on that of the harmonic.

What is claimed is:

1. Filter for a telecommunications device, comprising an acoustically active material (2) whose acoustic constants for tuning the filter during operation are modifiable at least in part, wherein the acoustically active material for tuning the filter during operation is located at least in part at a phase transition point and/or in the vicinity of a phase transition point, wherein the acoustically active material for tuning the filter during operation is located, at least in part, proximate a phase transition point of the acoustically active material so that the acoustic constants of the acoustically active material are influenced to provide a minimum change in speed of 5%.

2. Filter according to claim 1, wherein the acoustically active material (2) is at least in part a piezoelectric material.

3. Filter according to claim 2, wherein the phase transition point is the phase transition point between the ferroelectric phase and the paraelectric phase.

4. Filter according to claim 1, wherein the acoustically active material for tuning the filter during operation is located, at least in part, proximate a phase transition point of the acoustically active material so that the acoustic constants of the acoustically active material are influenced to provide a minimum change in speed of 10%.

5. Filter according to claim 1, further comprising means (3, 4, 5) for modifying the acoustic constants of the acoustically active material and/or connections for such means.

6. Filter according to claim 5, wherein the means (3, 4) for modifying the acoustic constants contain elements for applying an electrical voltage, by means of which the acoustic constants of the acoustically active material (2) can be modified.

7. Filter according to claim 5, wherein the means (5) for modifying the acoustic constants contain elements for setting the temperature, by means of which the acoustic constants of the acoustically active material (2) can be modified.

8. Filter according to claim 1, wherein the filter is a surface acoustic wave component, a bulk acoustic wave component and/or a diaphragm resonator.

9. Method for the operation of a filter (1) having an acoustically active material (2), which comprises:

modifying the acoustic constants of the acoustically active material (2) for tuning the filter during operation, and operating the acoustically active material (2) for tuning the filter during operation at least in part at a phase transition point and/or in the vicinity of a phase transition point so that the acoustically active material for tuning the filter during operation is located, at least in part, proximate a phase transition point of the acoustically active material so that the acoustic constants of the acoustically active material are influenced to provide a minimum change in speed of 5%.

10. Filter for a telecommunications device, comprising:

an acoustically active material (2) whose acoustic constants for tuning the filter during operation are modifiable, at least in part, so that the acoustically active material for tuning the filter during operation is located at least in part in the vicinity of a phase transition point; and means (3, 4, 5) for modifying the acoustic constants of the acoustically active material including elements for setting the temperature to modify the acoustic constants of the acoustically active material (2).

11. Filter according to claim 10, wherein the acoustically active material for tuning the filter during operation is located at the phase transition point.

12. Filter according to claim 10, wherein the acoustically active material (2) is at least in part a piezoelectric material.

13. Filter according to claim 12, wherein the phase transition point is the phase transition point between the ferroelectric phase and the paraelectric phase.

14. Filter according to at least claim 10, wherein the means (3, 4) for modifying the acoustic constants contain elements for applying an electrical voltage to modify the acoustic constants of the acoustically active material (2).

15. Filter according to claim 10, wherein the filter is one of a surface acoustic wave component, a bulk acoustic wave component and a diaphragm resonator.

16. Filter according to claim 10, wherein the acoustically active material for tuning the filter during operation is located, at least in part, proximate a phase transition point of the acoustically active material so that the acoustic constants of the acoustically active material are influenced to provide a minimum change in speed of 10%.

17. Filter according to claim 10, wherein the acoustically active material for tuning the filter during operation is located, at least in part, proximate a phase transition point of the acoustically active material so that the acoustic constants of the acoustically active material are influenced to provide a minimum change in speed of 10%.

* * * * *